(12) United States Patent
Gunji et al.

(10) Patent No.: US 11,574,983 B2
(45) Date of Patent: Feb. 7, 2023

(54) DISPLAY DEVICE COMPRISING TFT LAYER AND LIGHT-EMITTING ELEMENT LAYER

(71) Applicant: SHARP KABUSHIKI KAISHA, Sakai (JP)

(72) Inventors: Ryosuke Gunji, Sakai (JP); Tohru Okabe, Sakai (JP); Shinsuke Saida, Sakai (JP); Shinji Ichikawa, Sakai (JP); Kohji Ariga, Aioi (JP); Hiroki Taniyama, Sakai (JP); Yoshihiro Nakada, Yonago (JP); Koji Tanimura, Yonago (JP); Yoshihiro Kohara, Yonago (JP); Hiroharu Jinmura, Yonago (JP); Akira Inoue, Yonago (JP)

(73) Assignee: SHARP KABUSHIKI KAISHA, Sakai (JP)

(*) Notice: Subject to any disclaimer, the term of this patent is extended or adjusted under 35 U.S.C. 154(b) by 214 days.

(21) Appl. No.: 17/042,879

(22) PCT Filed: Mar. 30, 2018

(86) PCT No.: PCT/JP2018/013762
§ 371 (c)(1),
(2) Date: Sep. 28, 2020

(87) PCT Pub. No.: WO2019/187047
PCT Pub. Date: Oct. 3, 2019

(65) Prior Publication Data
US 2021/0057512 A1 Feb. 25, 2021

(51) Int. Cl.
*H01L 29/08* (2006.01)
*H01L 27/32* (2006.01)

(52) U.S. Cl.
CPC ...... *H01L 27/3276* (2013.01); *H01L 27/3258* (2013.01); *H01L 27/3262* (2013.01); *H01L 27/3265* (2013.01)

(58) Field of Classification Search
CPC ............ H01L 27/3276; H01L 27/3258; H01L 27/3262; H01L 27/3265
USPC .......................................................... 257/40
See application file for complete search history.

(56) References Cited

U.S. PATENT DOCUMENTS

| | | | |
|---|---|---|---|
| 2003/0067458 A1 | 4/2003 | Anzai | |
| 2008/0017866 A1 | 1/2008 | Sato | |
| 2011/0095297 A1 | 4/2011 | Sato | |
| 2013/0214280 A1 | 8/2013 | Sato | |
| 2014/0246678 A1 | 9/2014 | Sato | |
| 2015/0102343 A1* | 4/2015 | Park | H01L 27/3276 438/151 |

(Continued)

FOREIGN PATENT DOCUMENTS

| | | |
|---|---|---|
| JP | 2003-108032 A | 4/2003 |
| JP | 2008-046619 A | 2/2008 |
| JP | 2009-055065 A | 3/2009 |

*Primary Examiner* — Phuc T Dang
(74) *Attorney, Agent, or Firm* — ScienBiziP, P.C.

(57) ABSTRACT

In a display device, a second wiring line extends in a display region and includes an imaginary straight line that extends from the second wiring line in an extension direction of the second wiring line and intersects with an opening of an edge cover. The second wiring line extends along the peripheral edge of the opening without intersecting with the opening of the edge cover.

18 Claims, 6 Drawing Sheets

(56) References Cited

U.S. PATENT DOCUMENTS

| | | |
|---|---|---|
| 2015/0194447 A1 | 7/2015 | Sato |
| 2015/0263049 A1 | 9/2015 | Sato |
| 2016/0118505 A1 | 4/2016 | Sato |
| 2017/0054102 A1* | 2/2017 | Hong ................ H01L 51/56 |
| 2017/0141178 A1 | 5/2017 | Sato |
| 2017/0373094 A1 | 12/2017 | Park et al. |
| 2018/0070460 A1* | 3/2018 | Han ................ G06F 1/1626 |
| 2019/0096974 A1* | 3/2019 | Kim ................ H01L 27/3246 |

* cited by examiner

DISPLAY DEVICE COMPRISING TFT LAYER AND LIGHT-EMITTING ELEMENT LAYER

TECHNICAL FIELD

The disclosure relates to a display device.

BACKGROUND ART

PTL 1 discloses a technology in which a flattening film is provided on upper layers of a gate wiring line and a source wiring line so as to minimize unevenness in a reflective electrode (anode) formed on an upper layer of the flattening film.

CITATION LIST

Patent Literature

PTL 1: JP 2009-055065 A (published on Mar. 12, 2009)

SUMMARY

Technical Problem

The related art discloses a technology where a source wiring line with a large step extends intersecting with an opening of an edge cover covering a peripheral edge of a reflective electrode (anode) of a light-emitting element layer. When the source wiring line extends, unevenness is formed in the reflective electrode, degrading the reflectivity of light emitted from an EL layer.

Solution to Problem

A display device according to an aspect of the disclosure includes: a TFT layer formed on a substrate; and a light-emitting element layer formed as an upper layer overlying the TFT layer, in which the TFT layer includes a first metal layer, a first inorganic insulating film, a second metal layer, a second inorganic insulating film, a third metal layer, and a flattening film in this order, the light-emitting element layer includes a plurality of first electrodes, an edge cover including an opening and formed covering peripheral edges of the plurality of first electrodes, a function layer formed in the opening of the edge cover, and a second electrode shared by the plurality of first electrodes and formed as an upper layer overlying the function layer, a plurality of first wiring lines formed from the first metal layer are formed intersecting a plurality of second wiring lines formed from the third metal layer, an imaginary straight line extending from the plurality of second wiring lines in an extension direction of the plurality of second wiring lines intersects the opening of the edge cover, and the plurality of second wiring lines extend along a peripheral edge of the opening without intersecting the opening of the edge cover.

Advantageous Effects of Disclosure

According to an aspect of the disclosure, a decrease in the luminous efficiency of the EL layer can be suppressed.

DESCRIPTION OF EMBODIMENTS

Hereinafter, a "lower layer" refers to a layer formed in a process before the layer being compared, and an "upper layer" refers to a layer formed in a process after the layer being compared.

First Embodiment

Figure 1:
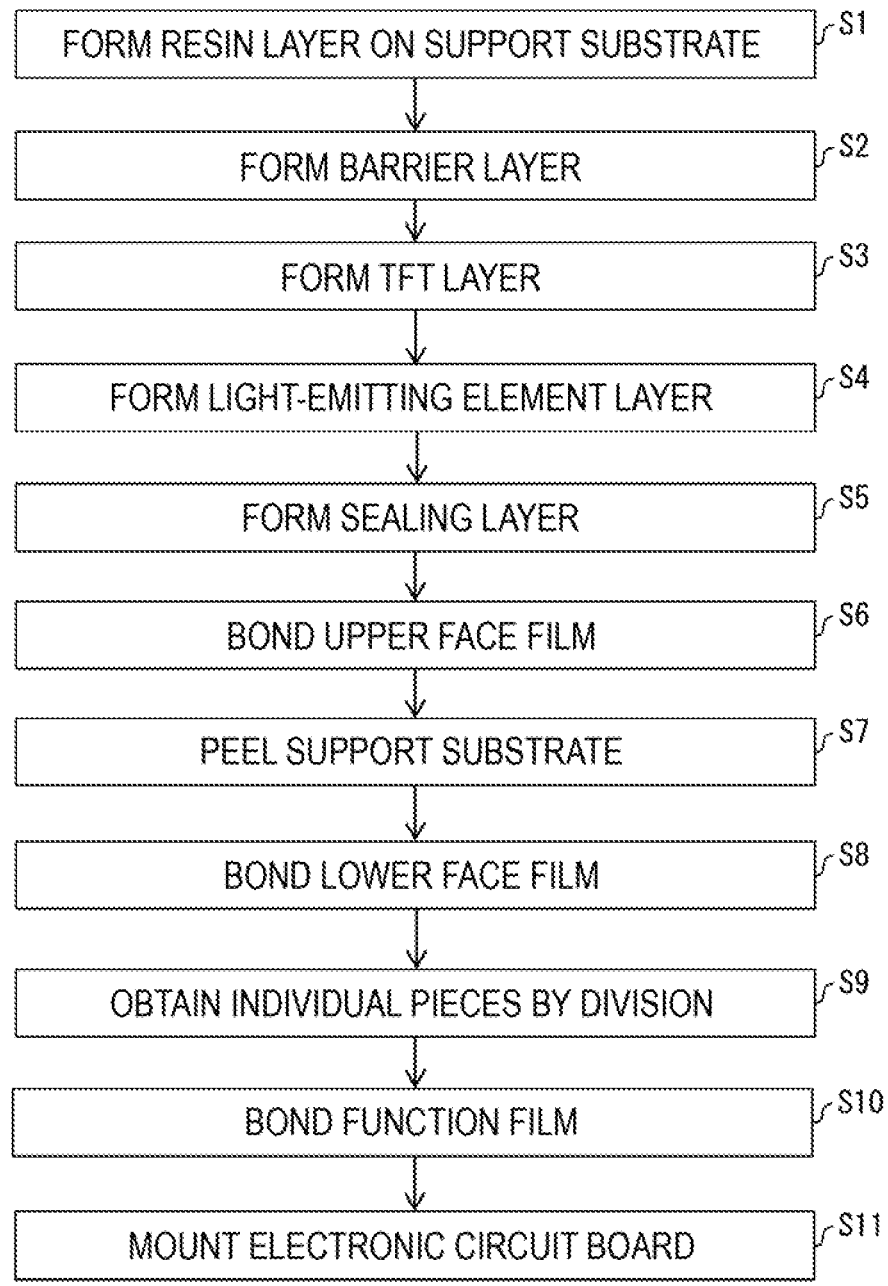
FIG. 1 is a flowchart illustrating an example of a method of manufacturing a display device.
Figure 2:
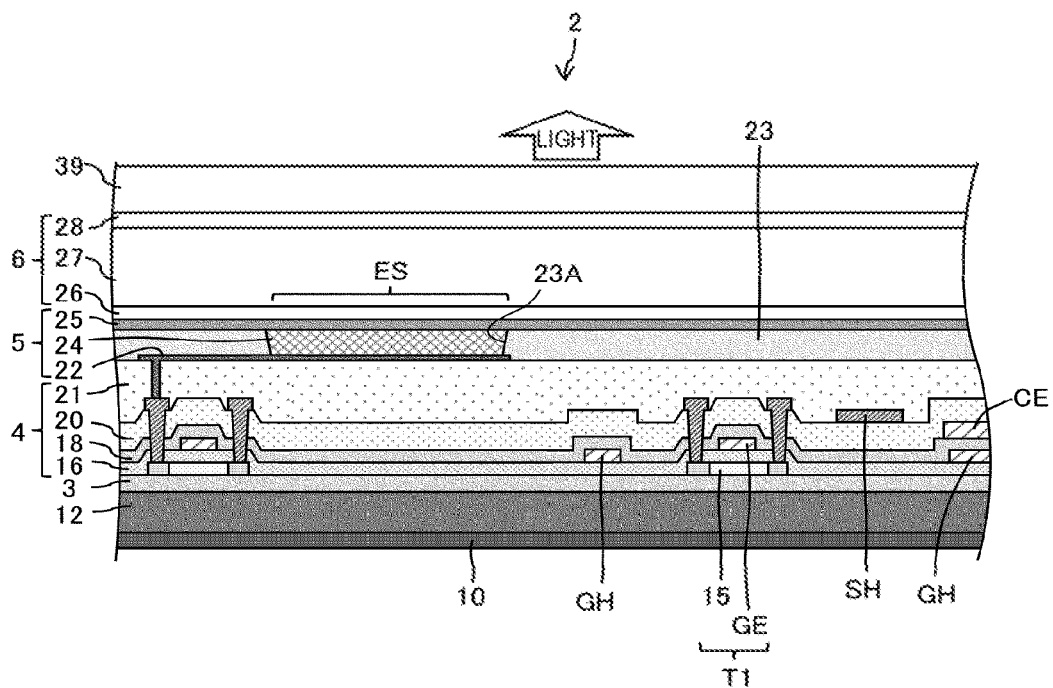
FIG. 2 is a cross-sectional view illustrating a configuration example of a display region of a display device.

FIG. 1 is a flowchart illustrating an example of a manufacturing method of a display device 2. FIG. 2 is a cross-sectional view illustrating the configuration of a display region of the display device 2.

When a flexible display device 2 is manufactured, as illustrated in FIG. 1 and FIG. 2, first, a resin layer 12 is formed on a transparent support substrate (a mother glass, for example) (step S). Next, a barrier layer 3 is formed (step S2). Next, a TFT layer 4 is formed (step S3). Next, a top-emitting type light-emitting element layer 5 is formed (step S4). Next, a sealing layer 6 is formed (step S5). Next, an upper face film is bonded to the sealing layer 6 (step S6).

Next, the support substrate is peeled from the resin layer 12 due to irradiation with a laser light or the like (step S7). Next, a lower face film 10 is bonded to the lower face of the resin layer 12 (step S8). Next, the layered body including the lower face film 10, the resin layer 12, the barrier layer 3, the TFT layer 4, the light-emitting element layer 5, and the sealing layer 6 is divided to obtain a plurality of individual pieces (step S9). Next, a function film 39 is bonded on the obtained individual pieces (step S10). Next, an electronic circuit board (for example, an IC chip or an FPC) is mounted on a portion (terminal portion) of the display region located further outward (a non-display region or a frame) than a portion where a plurality of subpixels are formed (step S11). Note that steps S1 to S11 are executed by a display device manufacturing apparatus (including a film formation apparatus that executes the process from step S1 to S5).

Examples of the material of the resin layer 12 include a polyimide and the like. A portion of the resin layer 12 can be replaced by two resin films (for example, polyimide films) with an inorganic insulating film sandwiched therebetween.

The barrier layer 3 is a layer that inhibits foreign matter such as water and oxygen from entering the TFT layer 4 and the light-emitting element layer 5, and can be constituted by a silicon oxide film, a silicon nitride film, or a silicon oxynitride film, or by a layered film of these, formed by chemical vapor deposition (CVD).

The TFT layer 4 includes a semiconductor layer, a third inorganic insulating film 16 as an upper layer overlying the semiconductor layer, a gate electrode GE and a first wiring line GH formed, from a first metal layer, as an upper layer overlying the third inorganic insulating film 16, a first inorganic insulating film 18 as an upper layer overlying the first metal layer, a capacitance electrode CE formed, from a second metal layer, as an upper layer overlying the first inorganic insulating film 18, a second inorganic insulating film 20 formed as an upper layer overlying the second metal layer, a second wiring line SH formed, from a third metal layer, as an upper layer overlying the second inorganic insulating film 20, and a flattening film 21 (interlayer insulating film) formed as an upper layer overlying the third metal layer.

The semiconductor layer is formed of, for example, low temperature polysilicon (LTPS) or an oxide semiconductor (for example, an In—Ga—Zn—O based semiconductor).

For example, a first semiconductor film 15 is formed from the semiconductor layer to form a first transistor (TFT) T1. In FIG. 2, the first transistor T1 is illustrated as a top gate structure, but the first transistor T1 may have a bottom gate structure.

The first metal layer, the second metal layer, and the third metal layer are each formed of a single layer film or a layered film of metal, the metal including at least one of aluminum, tungsten, molybdenum, tantalum, chromium, titanium, and copper, for example.

As described below, in particular, the second wiring line SH formed from the third metal layer preferably includes a data signal line or a high power supply voltage line, is preferably a wiring with low resistance, and is preferably a layered wiring line formed of a plurality of metal materials. For example, the second wiring line SH is preferably formed of a three-layered layered wiring line made up of, from the lower layer, titanium, aluminum, and titanium, or a two-layered layered wiring line made up of two layers of, from the lower layer, titanium and copper. Because the third metal layer preferably has low resistance, the third metal layer is thicker than the first metal layer and the second metal layer formed of a single layer of molybdenum or titanium.

As described above, the TFT layer 4 in FIG. 2 includes a single semiconductor film and a three-layered metal layer (the first metal layer, the second metal layer, and the third metal layer). However, yet another semiconductor film or a metal layer may be formed.

The third inorganic insulating film 16, the first inorganic insulating film 18, and the second inorganic insulating film 20 can be formed of, for example, a silicon oxide (SiOx) film or a silicon nitride (SiNx) film, or a layered film of these, formed using CVD. The flattening film 21 can be formed of, for example, a coatable organic material such as polyimide or acrylic.

The light-emitting element layer 5 includes an anode (first electrode) 22 formed as an upper layer overlying the flattening film 21, an edge cover 23 with insulating properties formed as an upper layer overlying the anode 22, an electroluminescent (EL) layer 24 (function layer, light-emitting element layer) formed as an upper layer overlying the edge cover 23, and a cathode 25 (second electrode) formed as an upper layer overlying the EL layer 24. The cathode 25 is provided covering the display region so as to be shared by a plurality of the anodes 22. The edge cover 23 is formed by applying an organic material such as a polyimide or an acrylic and then patterning the organic material by photolithography, for example.

On a subpixel-by-subpixel basis, a light-emitting element ES (for example, an organic light-emitting diode (OLED) or a quantum dot light-emitting diode (QLED)) including the island-shaped anode 22, the EL layer 24, and the cathode 25 is formed in the light-emitting element layer 5, and a subpixel circuit that controls the light-emitting element ES is formed in the TFT layer 4.

For example, the EL layers 24 are formed by layering a hole injection layer, a hole transport layer, a light-emitting layer, an electron transport layer, and an electron injection layer in this order, from the lower layer side. The light-emitting layer is formed into an island shape in an opening 23A of the edge cover 23 (on a subpixel-by-subpixel basis) by vapor deposition or an ink-jet method. The edge cover 23 is formed to cover the peripheral edge of the anode 22 and includes the opening 23A that exposes the anode 22.

The opening 23A serves as the light-emitting region of each sub-pixel.

Other layers are formed in an island shape or a solid-like shape (common layer). A configuration is also possible in which one or more layers are not formed among the hole injection layer, the hole transport layer, the electron transport layer, and the electron injection layer.

When the light-emitting layer of the OLED is formed by vapor deposition, a fine metal mask (FMM) is used. The FMM is a sheet with a large number of openings (for example, made of Invar material), and an island-shaped light-emitting layer (corresponding to one subpixel) is formed of an organic material passing through one of the openings.

With the light-emitting layer of the QLED, for example, an island-shaped light-emitting layer (corresponding to one subpixel) can be formed by ink-jet coating a solvent having quantum dots diffused therein.

The anodes 22 are formed by layering Indium Tin Oxide (ITO) and silver (Ag) or an alloy containing Ag, for example, and have light reflectivity. The cathodes (cathode electrode) 25 can be constituted by a transparent conductive material such as a MgAg alloy (extremely thin film), ITO, or IZO (indium zinc oxide).

In a case where the light-emitting element ES is an OLED, positive holes and electrons recombine inside the light-emitting layer in response to a drive current between the anode 22 and the cathode 25, and light is emitted when the excitons generated in this manner transition to a ground state. Because the cathode 25 is transparent and the anode 22 has light reflectivity, the light emitted from the EL layer 24 travels upward and becomes top-emitting.

In a case where the light-emitting element ES is a QLED, positive holes and electrons recombine inside the light-emitting layer in response to a drive current between the anode 22 and the cathode 25, and light (fluorescence) is emitted when the excitons generated in this manner transition from the conduction band of the quantum dot to the valence band.

A light-emitting element (such as an inorganic light-emitting diode) other than an OLED or QLED may be formed in the light-emitting element layer 5.

The sealing layer 6 is transparent, and includes an inorganic sealing film 26 for covering the cathode 25, an organic buffer film 27 formed as an upper layer overlying the inorganic sealing film 26, and an inorganic sealing film 28 formed as an upper layer overlying the organic buffer film 27. The sealing layer 6 covering the light-emitting element layer 5 inhibits foreign matter such as water and oxygen from penetrating the light-emitting element layer 5.

Each of the inorganic sealing film 26 and the inorganic sealing film 28 is an inorganic insulating film and can be formed of, for example, a silicon oxide film, a silicon nitride film, or a silicon oxynitride film, or a layered film of these, formed by CVD. The organic buffer film 27 is a transparent organic film having a flattening effect and can be formed of a coatable organic material such as an acrylic. The organic buffer film 27 can be formed, for example, by ink-jet application, and a bank for stopping droplets may be provided in the non-display region.

The lower face film 10 is a PET film, for example, bonded on the lower face of the resin layer 12 after the support substrate is peeled off to provide the display device 2 with excellent flexibility. The function film 39 has at least one of an optical compensation function, a touch sensor function, and a protection function, for example.

The flexible display device 2 has been described above, but when manufacturing the display device 2 as a non-flexible display device, because typical formation of the resin layer and replacement of the substrate is not required, the process proceeds to step S9 after the layering process on the glass substrate of steps S2 to S5 is executed. Note that when the display device is flexible, the substrate is the resin layer 12, and when the display device is non-flexible, the substrate is the support substrate.

Figure 3:
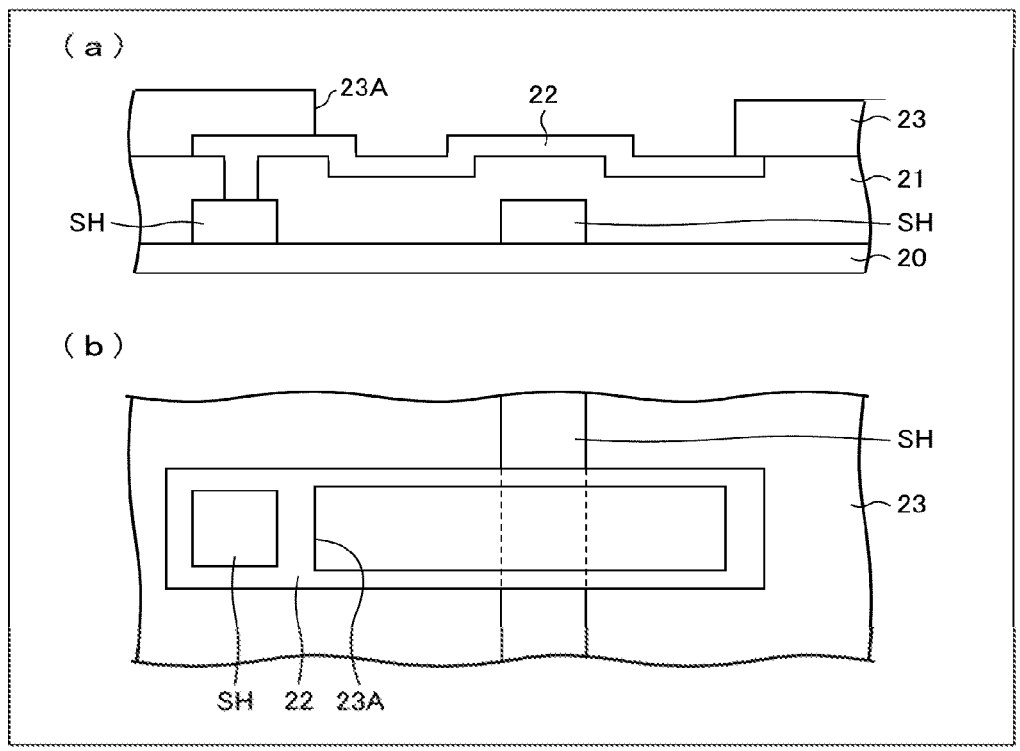
FIG. 3(a) is a diagram illustrating a main portion cross-section of a display device according to a comparative example.
FIG. 3(b) is a top view thereof.
Figure 4:
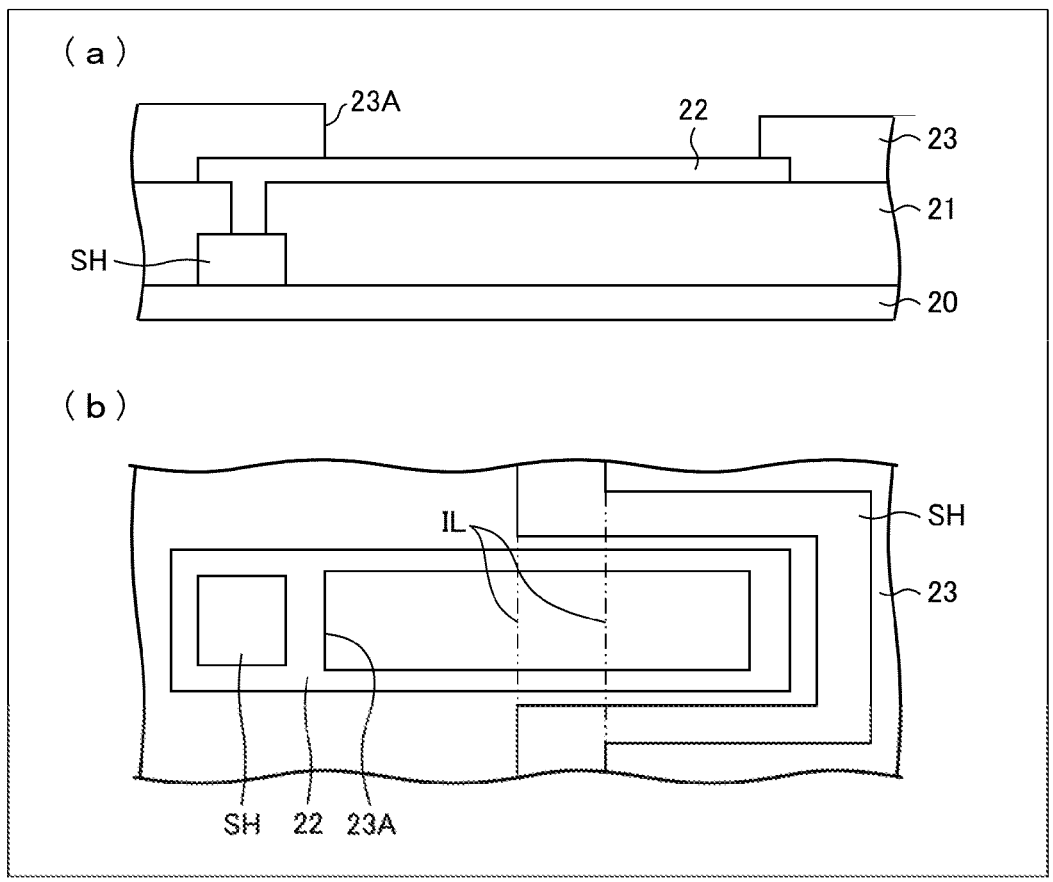
FIG. 4(a) is a diagram illustrating a main portion cross-section of a display device according to an embodiment.
FIG. 4(b) is a top view thereof.
Figure 5:
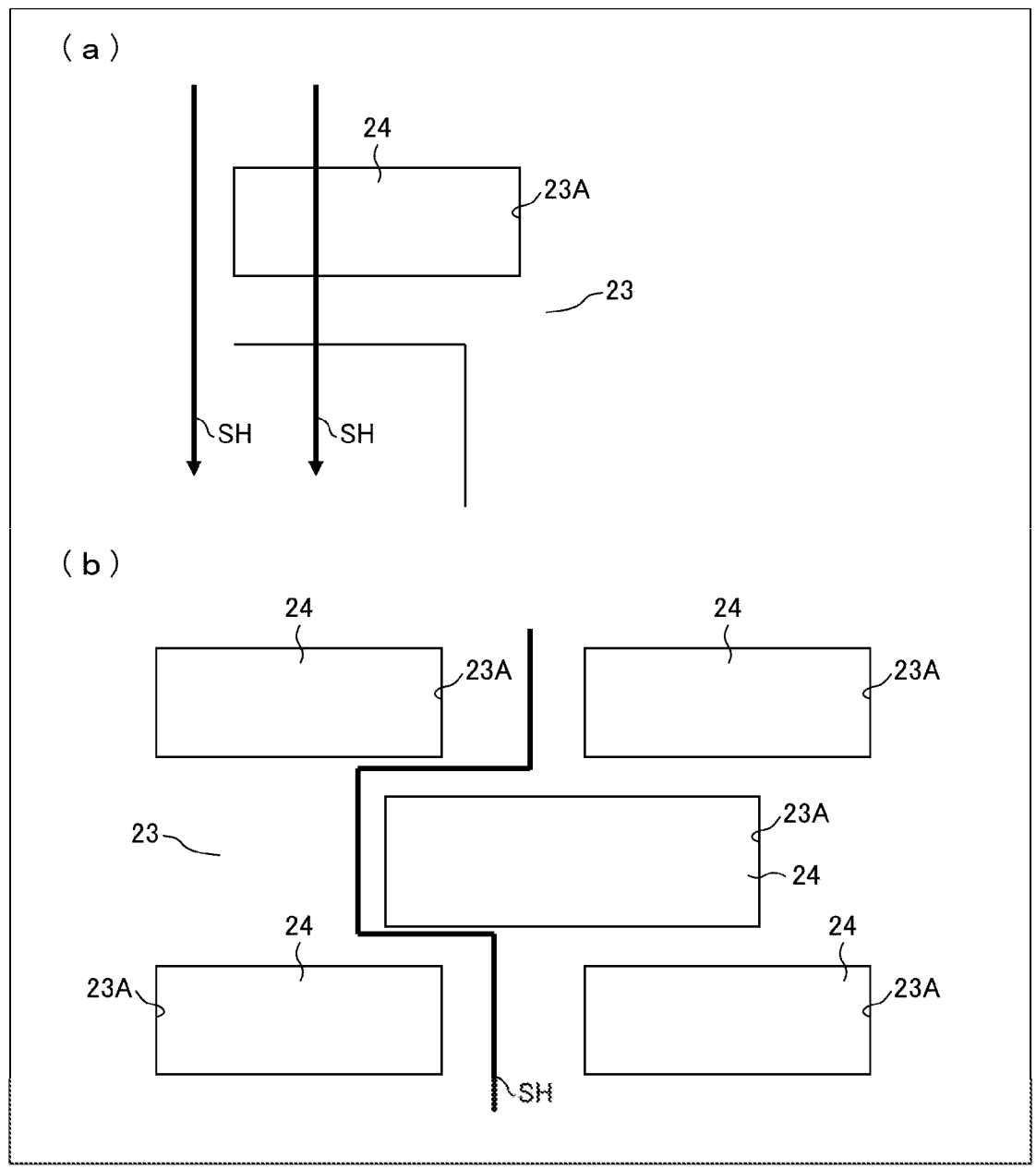
FIG. 5(a) is a schematic plan view illustrating the relationship between a second wiring line and an opening of an edge cover in a display device according to a comparative example.
FIG. 5(b) is a schematic plan view illustrating the relationship between a second wiring line and an opening of an edge cover in a display device according to an embodiment.

FIG. 3(a) is a diagram illustrating a main portion cross-section of a display device according to a comparative example, and FIG. 3(b) is a top view thereof. FIG. 4(a) is a diagram illustrating a main portion cross-section of a display device according to an embodiment, and FIG. 4(b) is a top view thereof. FIG. 5(a) is a schematic plan view illustrating the relationship between the second wiring line SH and the opening 23A of the edge cover 23 of the display device according to a comparative example. FIG. 5(b) is a schematic plan view illustrating the relationship between the second wiring line SH and the opening 23A of the edge cover 23 of the display device 2 according to the embodiment.

Light emitted from the light-emitting layer of the EL layer 24 toward the anode 22 is reflected by the anode 22, which functions as a silver reflective electrode, and is directed upward. This improves luminous efficiency. In addition, the organic layer corresponding to the wavelength of the light emitted from the light-emitting layer is formed above or below the light-emitting layer to create a cavity effect. This further improves luminous efficiency.

In order to improve luminous efficiency as described above, the surface of the anode 22 that functions as a silver reflective electrode needs to be uniform without unevenness. When unevenness is present on the surface of the anode 22, the extraction efficiency of light emitted from the light-emitting layer of the EL layer 24 is adversely affected. When there is a large step below the anode 22, the flattening film 21 may not be able to flatten the step. This causes unevenness in the surface of the anode 22. In the present embodiment, a step below the anode 22 that causes unevenness in the surface of the anode 22 is removed. This step is formed, in particular, due to the second wiring line SH having a thick film thickness and extending below the anode 22 intersecting with the opening 23A of the edge cover 23, as illustrated in FIG. 3 and FIG. 5(a).

In the present embodiment, as illustrated in FIG. 4(b) and FIG. 5(b), the second wiring line SH with imaginary straight lines IL extending in the extension direction and intersecting with the opening 23A of the edge cover 23 extends along the peripheral edge of the opening 23A without intersecting with the opening 23A of the edge cover 23. Accordingly, the surface of the anode 22 within the opening 23A of the edge cover 23 is uniform. Thus, the cavity effect and a decrease in the luminous efficiency of the light-emitting layer of the EL layer 24 can be suppressed.

The openings 23A of the edge cover 23 formed in the light-emitting element layer 5 are disposed in a staggered manner (PenTile shape) as illustrated in FIG. 5(b), and the second wiring line SH extends in a winding manner, not intersecting with the plurality of openings 23A of the edge cover 23 formed in the plurality of light-emitting element layers 5 when viewed from a direction perpendicular to the substrate. The second wiring line SH may extend so as to not overlap the openings 23A of the edge cover 23 and overlap the peripheral edge of the anode 22 when viewed from a direction perpendicular to the substrate. With such a configuration, the display region can be effectively utilized and wiring line density can be increased.

FIG. 6(a) is a circuit diagram of a subpixel circuit formed in the display device 2 according to the embodiment. FIG. 6(b) is a diagram schematically illustrating the relationship between the first transistor T1, a second transistor T2, and a third transistor T3 formed in the subpixel circuit, and the opening 23A of the edge cover 23.

Figure 6:
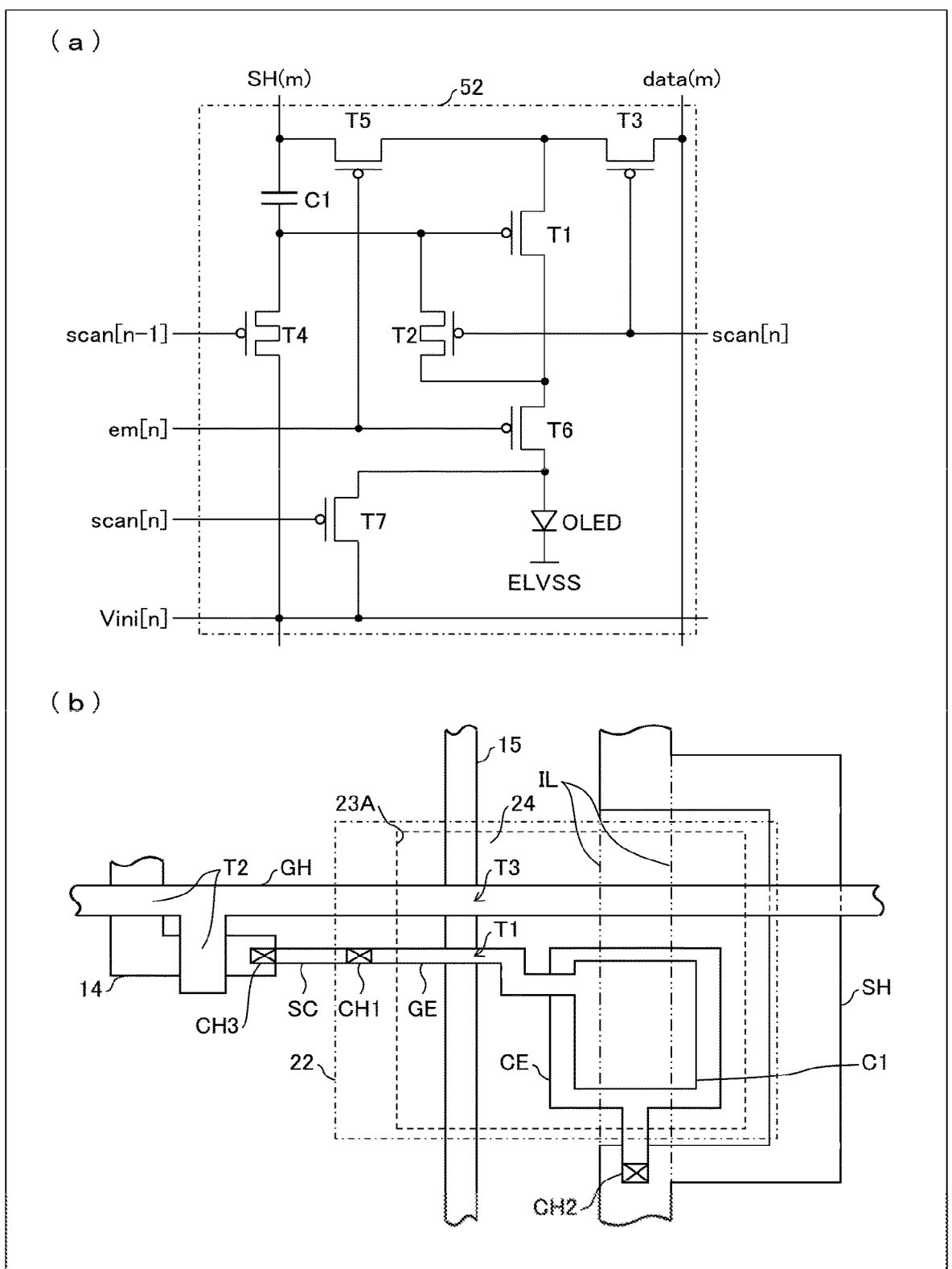
FIG. 6(a) is a circuit diagram of a subpixel circuit formed in a display device according to an embodiment.
FIG. 6(b) is a diagram schematically illustrating the relationship between transistors formed in the subpixel circuit and an opening of an edge cover.

The second wiring line SH includes a data signal line and/or a high power supply voltage line. In the example of FIG. 6, the second wiring line SH is a high power supply voltage line.

A plurality of data signal lines (data) and a plurality of scanning signal lines (scan) orthogonal to the data signal lines are arranged in the display region. A plurality of light emission control lines (em) are arranged in the display region corresponding one-to-one with the plurality of scanning signal lines. Furthermore, a subpixel circuit 52 is provided corresponding to points in the display region where the plurality of data signal lines and the plurality of scanning signal lines intersect. A matrix of a plurality of pixels is formed in the display region by providing the subpixel circuits 52 in this manner.

The cathode 25 common to each of the subpixel circuits 52 is provided in the display region and is electrically connected to a low-level power supply voltage ELVSS.

More specifically, a high power supply voltage line that supplies a high-level power supply voltage ELVDD for driving an organic EL element, a cathode that supplies the low-level power supply voltage ELVSS for driving an organic EL element, and an initialization power source line that supplies an initialization voltage Vini are arranged. A plurality of the high power supply voltage lines are formed orthogonal to the scanning signal lines. The high-level power supply voltage ELVDD, the low-level power supply voltage ELVSS, and the initialization voltage Vini are supplied from a power source circuit (not illustrated).

Next, a configuration of the subpixel circuit 52 in the display region will be described. FIG. 6(a) is a circuit diagram illustrating the configuration of the subpixel circuit 52 corresponding to an mth column and an nth row. Note that the configuration of the subpixel circuit 52 described here is merely one example, and another known configuration can be employed instead. The subpixel circuit 52 includes one organic EL element OLED, seven transistors T1 to T7 (the drive transistor T1, the write control transistor T3, a power supply control transistor T5, a light emission control transistor T6, the threshold voltage compensation transistor T2, and initialization transistors T4, T7), and one capacitor C1. The transistors T1 to T6 are p-channel transistors. The capacitor C1 is a capacitance element constituted by two electrodes (the gate electrode GE and the capacitance electrode CE).

However, the subpixel circuit 52 described above is an example, and the subpixel circuit 52 may be constituted by an n-channel transistor.

The first transistor T1 is formed with the first semiconductor film 15 and the gate electrode GE overlapping at a position overlapping the opening 23A of the edge cover 23.

A connection wiring line SC formed from the third metal layer is electrically connected to the gate electrode GE of the first transistor T1 via a first contact hole CH1 formed in the second inorganic insulating film 20 and the first inorganic insulating film 18. The first contact hole CH1 is formed at a position not overlapping the opening 23A of the edge cover 23 when viewed from a direction perpendicular to the substrate. As illustrated in FIG. 6(b), the first contact hole CH1 may be formed overlapping the anode 22. With such a configuration, the display region can be effectively utilized and wiring line density can be increased.

The capacitor C1 is formed overlapping the opening 23A of the edge cover 23.

With such a configuration, the display region can be effectively utilized and wiring line density can be increased. The capacitor C1 is formed by the capacitance electrode CE and the gate electrode GE of the first transistor T1 via the first inorganic insulating film 18.

The capacitance electrode CE extends across the opening 23A of the edge cover 23, overlaps with the high power supply voltage line, and connects with the high power supply voltage line via a second contact hole CH2 formed in the second inorganic insulating film 20. The second contact hole CH2 is formed at a position not overlapping the opening 23A of the edge cover 23. The second contact hole CH2 may also be formed overlapping the anode 22. With such a configuration, the display region can be effectively utilized and wiring line density can be increased. Here also, the second wiring line SH may, near the second contact hole CH2, extend so as to not overlap the openings 23A of the edge cover 23 and overlap the peripheral edge of the anode 22 when viewed from a direction perpendicular to the substrate.

The connection wiring line SC formed from the third metal layer is electrically connected to a semiconductor region (source region, drain region) of a second semiconductor film (constituting the second transistor T2) formed in the same layer and from the same material as the semiconductor layer via a third contact hole CH3 formed in the first inorganic insulating film 18, the second inorganic insulating film 20 and the third inorganic insulating film 16. The third contact hole CH3 is formed at a position not overlapping the opening 23A of the edge cover 23 when viewed from a direction perpendicular to the substrate. The third contact hole CH3 may also be formed overlapping the anode 22. As described above, the connection wiring line SC is wiring line that electrically connects the gate electrode GH of the first transistor T1 and the conduction terminal (source region or drain region) of the second transistor T2.

In FIG. 6(b), the first wiring line GH is a scanning signal line and overlaps the second semiconductor film 14 at a position that does not overlap the opening 23A in the edge cover 23 to form the second transistor T2. The first wiring line GH also forms the third transistor T3 by overlapping the first semiconductor film 15 at a position overlapping the opening 23A of the edge cover 23.

Modification Example

Figure 7:
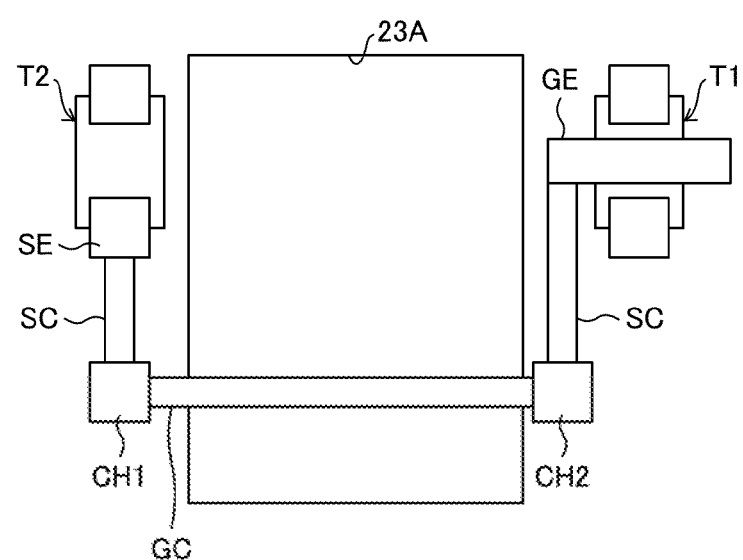
FIG. 7 is a diagram schematically illustrating the relationship between transistors formed in a subpixel circuit and an opening of an edge cover according to a modification example.

FIG. 7 is a diagram schematically illustrating the relationship between the second transistor T2 and the first transistor T1 formed in the subpixel circuit and the opening 23A of the edge cover 23 according to a modification example.

In the modification example, when display of the display device is made high definition, a lead wiring line GC is formed that leads the connection wiring line SC formed from the third metal layer to the first metal layer or the second metal layer (the first metal layer in FIG. 7).

For example, the first contact hole CH1 and the second contact hole CH2 are formed in the first inorganic insulating film 18 and the second inorganic insulating film 20. As illustrated in FIG. 7, the connection wiring line SC connected to a source electrode SE of the second transistor T2 is electrically connected to the lead wiring line GC via the first contact hole CH1. The lead wiring line GC extends across the opening 23A of the edge cover 23. The lead wiring line GC extending across the opening 23A is electrically connected to the connection wiring line SC electrically connected to the gate electrode GE of the first transistor T1 via the second contact hole CH2.

Supplement

An electro-optical element (an electro-optical element whose luminance and transmittance are controlled by an electric current) that is provided in a display device according to the present embodiment is not particularly limited thereto. Examples of the display device according to the present embodiment include an organic electro luminescent (EL) display provided with an organic light-emitting diode (OLED) as the electro-optical element, an inorganic EL display provided with an inorganic light-emitting diode as the electro-optical element, and a quantum dot light-emitting diode (QLED) display provided with a QLED as the electro-optical element.

First Aspect

A display device includes:

a TFT layer formed on a substrate, and a light-emitting element layer formed as an upper layer overlying the TFT layer, in which the TFT layer includes a first metal layer, a first inorganic insulating film, a second metal layer, a second inorganic insulating film, a third metal layer, and a flattening film in this order, the light-emitting element layer includes a plurality of first electrodes, an edge cover including an opening and formed covering peripheral edges of the plurality of first electrodes, a function layer formed in the opening of the edge cover, and a second electrode shared by the plurality of first electrodes and formed as an upper layer overlying the function layer, a plurality of first wiring lines formed from the first metal layer are formed intersecting a plurality of second wiring lines formed from the third metal layer, an imaginary straight line extending from the plurality of second wiring lines in an extension direction of the plurality of second wiring lines intersects the opening of the edge cover, and the plurality of second wiring lines extend along a peripheral edge of the opening of the edge cover without intersecting the opening.

Second Aspect

In the display device according to the first aspect, the plurality of second wiring lines include a data signal line and/or high power supply voltage line.

Third Aspect

In the display device according to the second aspect, the plurality of second wiring lines extend along the peripheral edge of the opening of the edge cover without intersecting the opening, then extend in a direction of the imaginary straight line at an intersection position with the imaginary straight line.

Fourth Aspect

In the display device according to the first or second aspects, a display region is provided with a plurality of subpixel circuits corresponding to subpixels, each of the plurality of subpixel circuits include a plurality of transistors, a first transistor is formed at a position overlapping the opening of the edge cover such that a first semiconductor film and a gate electrode formed from the first metal layer overlap, a connection wiring line formed from the third metal layer is electrically connected to the gate electrode via a first contact hole formed in the first inorganic insulating film and the second inorganic insulating film, and the first contact hole is formed at a position not overlapping the opening of the edge cover as viewed from a direction perpendicular to the substrate.

Fifth Aspect

In the display device according to the fourth aspect, each of the plurality of subpixel circuits includes a capacitor formed overlapping the opening of the edge cover, and the capacitor is formed by a capacitance electrode formed from the second metal layer and the gate electrode via the first inorganic insulating film.

Sixth Aspect

In the display device according to the fifth aspect, the plurality of second wiring lines are high power supply voltage lines, the capacitance electrode extends across the opening of the edge cover, overlaps the high power supply voltage line, and is connected to the high power supply voltage line via a second contact hole formed in the second inorganic insulating film, and the second contact hole does not overlap the opening of the edge cover.

Seventh Aspect

In the display device according to any one of the fourth to sixth aspects, the TFT layer further includes a third inorganic insulating film closer to a substrate than the first metal layer, the first semiconductor film is formed between the substrate and the third inorganic insulating film, and the connection wiring line is electrically connected to a second semiconductor film formed from identical materials and in an identical layer as the first semiconductor film via a third contact hole formed in the first inorganic insulating film, the second inorganic insulating film, and the third inorganic insulating film.

Eighth Aspect

In the display device according to the seventh aspect, the plurality of first wiring lines are scanning signal lines that overlap the second semiconductor film at positions not overlapping the opening of the edge cover to form a second transistor.

Ninth Aspect

In the display device according to any one of the first to eighth aspects, the plurality of second wiring lines are thicker than the first metal layer.

Tenth Aspect

In the display device according to any one of the first to ninth aspects, the plurality of second wiring lines are layered wiring lines made of a plurality of metal materials.

Eleventh Aspect

In the display device according to any one of the first to tenth aspects, the function layer includes a plurality of light-emitting element layers, the plurality of light-emitting element layers are disposed in a staggered manner as viewed from a direction perpendicular to the substrate, and the plurality of second wiring lines, as viewed from the direction perpendicular to the substrate, extend in a winding manner without intersecting a plurality of openings in the edge cover where the plurality of light-emitting element layers are formed.

Twelfth Aspect

In the display device according to any one of the first to eleventh aspects, the plurality of second wiring lines extend overlapping the peripheral edges of the plurality of first electrodes as viewed from a direction perpendicular to the substrate.

Thirteenth Aspect

In the display device according to fourth aspect, the first contact hole is formed overlapping the plurality of first electrodes.

The disclosure is not limited to each of the embodiments described above, and various modifications may be made within the scope of the claims. Embodiments obtained by appropriately combining technical approaches disclosed in each of the different embodiments also fall within the technical scope of the disclosure. Moreover, novel technical features can be formed by combining the technical approaches disclosed in the embodiments.

The invention claimed is:
1. A display device, comprising:
a TFT layer formed on a substrate; and
a light-emitting element layer formed as an upper layer overlying the TFT layer, wherein the TFT layer includes a first metal layer, a first inorganic insulating film, a second metal layer, a second inorganic insulating film, a third metal layer, and a flattening film in this order, the light-emitting element layer includes a plurality of first electrodes, an edge cover including an opening and formed covering peripheral edges of the plurality of first electrodes, a function layer formed in the opening of the edge cover, and a second electrode shared by the plurality of first electrodes and formed as an upper layer overlying the function layer, a plurality of first wiring lines formed from the first metal layer are formed intersecting a plurality of second wiring lines formed from the third metal layer, an imaginary straight line extending from the plurality of second wiring lines in an extension direction of the plurality of second wiring lines intersects the opening of the edge cover, the plurality of second wiring lines extend along a peripheral edge of the opening of the edge cover without intersecting the opening, the plurality of second wiring lines include a data signal line and/or a high power supply voltage line, and the plurality of second wiring lines extend along the peripheral edge of the opening of the edge cover without intersecting the opening, then extend in a direction of the imaginary straight line at an intersection position with the imaginary straight line.

2. The display device according to claim 1, wherein the plurality of second wiring lines are thicker than the first metal layer.

3. The display device according to claim 1, wherein the plurality of second wiring lines are layered wiring lines made of a plurality of metal materials.

4. The display device according to claim 1,
wherein the function layer includes a plurality of light-emitting element layers,
the plurality of light-emitting element layers are disposed in a staggered manner as viewed from a direction perpendicular to the substrate, and
the plurality of second wiring lines, as viewed from a direction perpendicular to the substrate, extend in a winding manner without intersecting a plurality of openings in the edge cover where the plurality of light-emitting element layers are formed.

5. The display device according to claim 1, wherein the plurality of second wiring lines extend overlapping peripheral edges of the plurality of first electrodes as viewed from a direction perpendicular to the substrate.

6. A display device, comprising:
a TFT layer formed on a substrate; and
a light-emitting element layer formed as an upper layer overlying the TFT layer,
wherein the TFT layer includes a first metal layer, a first inorganic insulating film, a second metal layer, a second inorganic insulating film, a third metal layer, and a flattening film in this order,
the light-emitting element layer includes a plurality of first electrodes, an edge cover including an opening and formed covering peripheral edges of the plurality of first electrodes, a function layer formed in the opening of the edge cover, and a second electrode shared by the plurality of first electrodes and formed as an upper layer overlying the function layer,
a plurality of first wiring lines formed from the first metal layer are formed intersecting a plurality of second wiring lines formed from the third metal layer, an imaginary straight line extending from the plurality of second wiring lines in an extension direction of the plurality of second wiring lines intersects the opening of the edge cover, the plurality of second wiring lines extend along a peripheral edge of the opening of the edge cover without intersecting the opening, a display region is provided with a plurality of subpixel circuits corresponding to subpixels;

each of the plurality of subpixel circuits includes a plurality of transistors, a first transistor is formed at a position overlapping the opening of the edge cover such that a first semiconductor film and a gate electrode formed from the first metal layer overlap, a connection wiring line formed from the third metal layer is electrically connected to the gate electrode via a first contact hole formed in the first inorganic insulating film and the second inorganic insulating film, and the first contact hole is formed at a position not overlapping the opening of the edge cover as viewed from a direction perpendicular to the substrate.

7. The display device according to claim 6,
wherein each of the plurality of subpixel circuits includes a capacitor formed overlapping the opening of the edge cover, and
the capacitor is formed by a capacitance electrode formed from the second metal layer and the gate electrode via the first inorganic insulating film.

8. The display device according to claim 7,
wherein the plurality of second wiring lines are high power supply voltage lines,
the capacitance electrode extends across the opening of the edge cover, overlaps the high power supply voltage line, and is connected to the high power supply voltage line via a second contact hole formed in the second inorganic insulating film, and
the second contact hole does not overlap the opening of the edge cover.

9. The display device according to claim 6,
wherein the TFT layer further includes a third inorganic insulating film closer to the substrate than the first metal layer,
the first semiconductor film is formed between the substrate and the third inorganic insulating film, and
the connection wiring line is electrically connected to a second semiconductor film formed from an identical material and in an identical layer as the first semiconductor film via a third contact hole formed in the first inorganic insulating film, the second inorganic insulating film, and the third inorganic insulating film.

10. The display device according to claim 9, wherein the plurality of first wiring lines are scanning signal lines that overlap the second semiconductor film at positions not overlapping the opening of the edge cover to form a second transistor.

11. The display device according to claim 6, wherein the first contact hole is formed overlapping the plurality of first electrodes.

12. The display device according to claim 6, wherein the plurality of second wiring lines are thicker than the first metal layer.

13. The display device according to claim 6, wherein the plurality of second wiring lines are layered wiring lines made of a plurality of metal materials.

14. The display device according to claim 6,
wherein the function layer includes a plurality of light-emitting element layers,
the plurality of light-emitting element layers are disposed in a staggered manner as viewed from a direction perpendicular to the substrate, and
the plurality of second wiring lines, as viewed from a direction perpendicular to the substrate, extend in a winding manner without intersecting a plurality of openings in the edge cover where the plurality of light-emitting element layers are formed.

15. The display device according to claim 6, wherein the plurality of second wiring lines extend overlapping peripheral edges of the plurality of first electrodes as viewed from a direction perpendicular to the substrate.

16. A display device, comprising:
a TFT layer formed on a substrate; and
a light-emitting element layer formed as an upper layer overlying the TFT layer,
wherein the TFT layer includes a first metal layer, a first inorganic insulating film, a second metal layer, a second inorganic insulating film, a third metal layer, and a flattening film in this order,
the light-emitting element layer includes a plurality of first electrodes, an edge cover including an opening and formed covering peripheral edges of the plurality of first electrodes, a function layer formed in the opening of the edge cover, and a second electrode shared by the plurality of first electrodes and formed as an upper layer overlying the function layer,
a plurality of first wiring lines formed from the first metal layer are formed intersecting a plurality of second wiring lines formed from the third metal layer,
an imaginary straight line extending from the plurality of second wiring lines in an extension direction of the plurality of second wiring lines intersects the opening of the edge cover,
the plurality of second wiring lines extend along a peripheral edge of the opening of the edge cover without intersecting the opening, and
the plurality of second wiring lines extend overlapping peripheral edges of the plurality of first electrodes as viewed from a direction perpendicular to the substrate.

17. The display device according to claim 16, wherein the plurality of second wiring lines include a data signal line and/or a high power supply voltage line.

18. The display device according to claim 17,
wherein a display region is provided with a plurality of subpixel circuits corresponding to subpixels;
each of the plurality of subpixel circuits includes a plurality of transistors,
a first transistor is formed at a position overlapping the opening of the edge cover such that a first semiconductor film and a gate electrode formed from the first metal layer overlap,
a connection wiring line formed from the third metal layer is electrically connected to the gate electrode via a first contact hole formed in the first inorganic insulating film and the second inorganic insulating film, and
the first contact hole is formed at a position not overlapping the opening of the edge cover as viewed from a direction perpendicular to the substrate.

* * * * *